(12) United States Patent
Yang et al.

(10) Patent No.: US 9,263,522 B2
(45) Date of Patent: Feb. 16, 2016

(54) TRANSISTOR WITH A DIFFUSION BARRIER

(71) Applicant: QUALCOMM Incorporated, San Diego, CA (US)

(72) Inventors: Bin Yang, San Diego, CA (US); Xia Li, San Diego, CA (US); PR Chidambaram, San Diego, CA (US)

(73) Assignee: QUALCOMM Incorporated, San Dieogo, CA (US)

( * ) Notice: Subject to any disclaimer, the term of this patent is extended or adjusted under 35 U.S.C. 154(b) by 0 days.

(21) Appl. No.: 14/100,760

(22) Filed: Dec. 9, 2013

(65) Prior Publication Data

US 2015/0162405 A1 Jun. 11, 2015

(51) Int. Cl.
| | |
|---|---|
| *H01L 29/15* | (2006.01) |
| *H01L 29/10* | (2006.01) |
| *H01L 29/205* | (2006.01) |
| *H01L 29/66* | (2006.01) |
| *H01L 21/74* | (2006.01) |
| *H01L 29/78* | (2006.01) |

(52) U.S. Cl.
CPC .......... *H01L 29/1045* (2013.01); *H01L 21/743* (2013.01); *H01L 29/1054* (2013.01); *H01L 29/1087* (2013.01); *H01L 29/205* (2013.01); *H01L 29/66522* (2013.01); *H01L 29/66636* (2013.01); *H01L 29/785* (2013.01); *H01L 29/7834* (2013.01); *H01L 29/7848* (2013.01)

(58) Field of Classification Search
CPC ... H01L 29/78; H01L 27/088; H01L 29/1045; H01L 29/1054; H01L 21/743

USPC .............................. 257/76, E27.055; 438/309
See application file for complete search history.

(56) References Cited

U.S. PATENT DOCUMENTS

| | | | |
|---|---|---|---|
| 6,426,279 B1 | 7/2002 | Huster et al. | |
| 6,512,252 B1 | 1/2003 | Takagi et al. | |
| 6,946,691 B2 | 9/2005 | Nakamoto | |
| 7,491,988 B2 | 2/2009 | Tolchinsky et al. | |
| 8,247,300 B2 | 8/2012 | Babcock et al. | |
| 2004/0005112 A1* | 1/2004 | Geva et al. ...................... | 385/16 |
| 2009/0004881 A1* | 1/2009 | Chen ............................. | 438/763 |
| 2009/0242873 A1 | 10/2009 | Pillarisetty et al. | |
| 2010/0279481 A1* | 11/2010 | Babcock et al. .............. | 438/311 |
| 2013/0056795 A1 | 3/2013 | Wu et al. | |
| 2013/0119469 A1* | 5/2013 | Iwamatsu ........... | H01L 27/0207 257/347 |
| 2013/0122665 A1* | 5/2013 | Chan ................... | H01L 21/7624 438/154 |
| 2013/0181298 A1 | 7/2013 | Shifren et al. | |

OTHER PUBLICATIONS

International Search Report and Written Opinion—PCT/US2014/066676—ISA/EPO—Feb. 27, 2015.

* cited by examiner

*Primary Examiner* — Matthew Gordon
(74) *Attorney, Agent, or Firm* — Toler Law Group, PC

(57) ABSTRACT

An apparatus comprises a substrate. The apparatus also comprises a diffusion barrier formed on a surface of a first region of the substrate. The diffusion barrier is formed using a first material having a first band gap energy. The apparatus further comprises a channel region formed on a surface of the diffusion barrier. The channel region is formed using a second material having a second band gap energy that is lower than the first band gap energy. The apparatus further comprises a back gate contact coupled to the first region of the substrate.

17 Claims, 10 Drawing Sheets

TRANSISTOR WITH A DIFFUSION BARRIER

I. FIELD

The present disclosure is generally related to transistors.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones comprise other types of devices that are incorporated therein. For example, a wireless telephone can also comprise a digital still camera, a digital video camera, a digital recorder, and an audio file player. Also, such wireless telephones can process executable instructions, including software applications, such as a web browser application, that can be used to access the Internet. As such, these wireless telephones can comprise significant computing capabilities.

Mobile devices (e.g., smartphones, tablet computers, laptop computers, etc.) may be implemented using transistors, such as metal-oxide semiconductor field-effect transistors (MOSFETs). A threshold voltage of a MOSFET may be controlled by doping parts of the MOSFET according to a super sharp retrograde doping profile. To implement the super sharp retrograde doping profile, a channel region (e.g., a region directly under a gate of a MOSFET) and a region under the channel region ("heavily doped region") may be doped using different doping concentrations. A height of the channel region may be varied to control the device threshold voltage. For example, the channel region may be undoped or may have a lower doping concentration as compared to a doping concentration of the heavily doped region. However, a conventional silicon MOSFET employing the super sharp retrograde doping profile may not have a dopant diffusion barrier to reduce dopant diffusion from the heavily doped region to the channel region. Thus, the width of the channel region is reduced due to dopant diffusion, resulting in a targeted device threshold voltage that may not be obtained.

III. SUMMARY

Systems and methods of reducing dopant diffusion of a MOSFET that is doped based on a super sharp retrograde doping profile (e.g., a channel region and a region under the channel region are doped using different doping concentrations) are disclosed. When a MOSFET is manufactured using a super sharp retrograde doping profile, the described techniques may use a diffusion barrier to reduce dopant diffusion from a heavily doped region to a channel region. The diffusion barrier may be formed using a III-V compound (e.g., a compound material formed using elements in groups III and V of the periodic table) or a II-VI compound (e.g., a compound material formed using elements in groups II and VI of the periodic table). For example, the diffusion barrier may be formed using aluminum arsenide (AlAs). As another example, the diffusion barrier may be formed using indium aluminum arsenide (InAlAs). Thus, dopant diffusion may be reduced as compared to a silicon MOSFET doped based on a super sharp retrograde doping profile that does not have a diffusion barrier.

In a particular embodiment, an apparatus comprises a substrate and a diffusion barrier formed on a surface of a first region of the substrate. The diffusion barrier is formed using a first material having a first band gap energy. The apparatus also comprises a channel region formed on a surface of the diffusion barrier. The channel region is formed using a second material having a second band gap energy that is lower than the first band gap energy. The apparatus further comprises a back gate contact coupled to the first region of the substrate.

In a particular embodiment, a method comprises forming a diffusion barrier on a surface of a heavily doped region of a substrate. The diffusion barrier is formed using a first material having a first band gap energy. The method also comprises forming a channel region on a surface of the diffusion barrier. The channel region is formed using a second material having a second band gap energy that is lower than the first band gap energy. The method further comprises etching particular regions of the channel region to form a source region and a drain region.

One particular advantage provided by at least one of the disclosed embodiments is an ability to manufacture a MOSFET employing a super sharp retrograde doping profile with reduced dopant diffusion. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
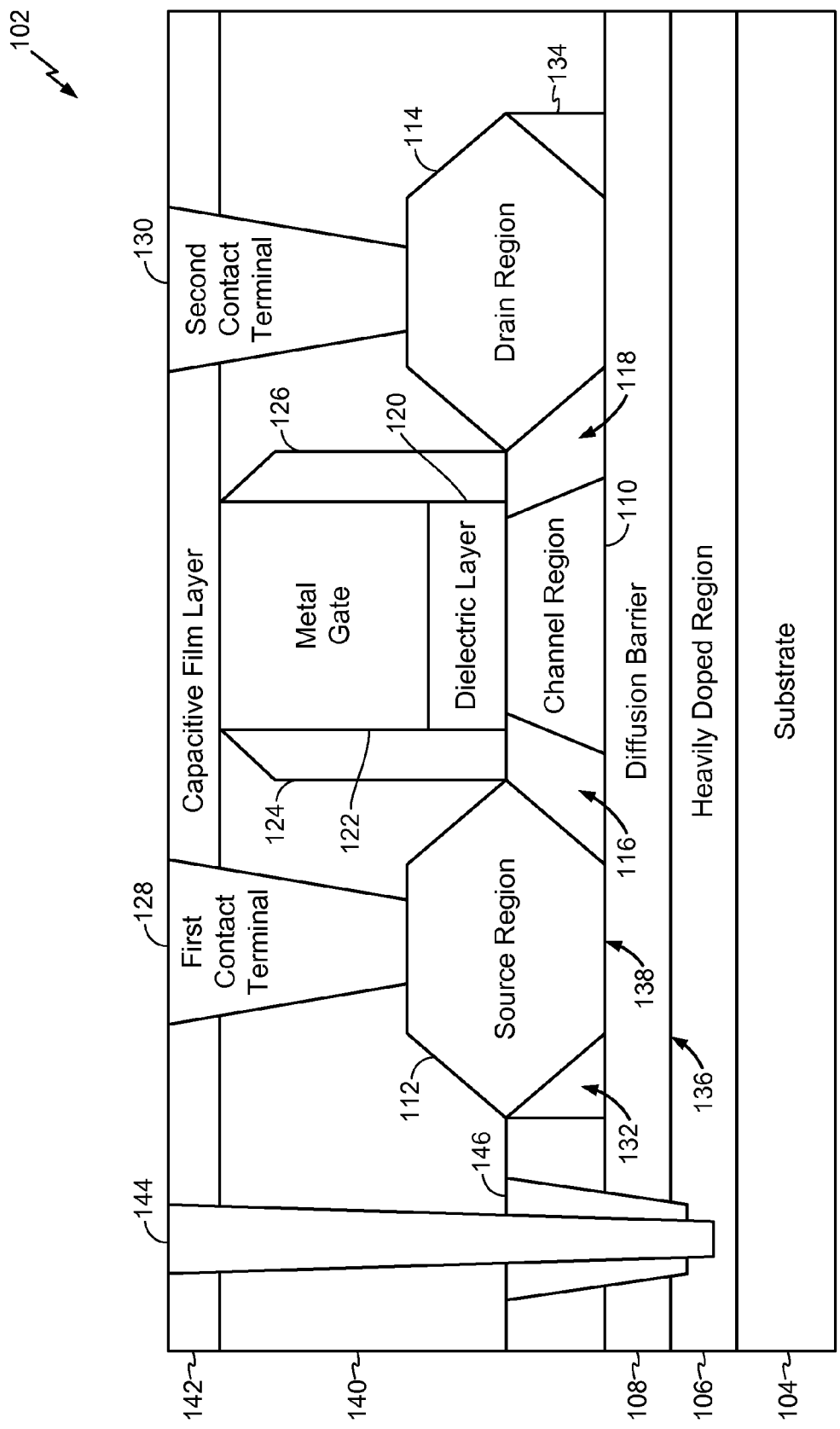
FIG. 1 is a diagram that illustrates a particular embodiment of a planar metal-oxide semiconductor field-effect transistor (MOSFET) having a diffusion barrier.

FIG. 1 illustrates a particular embodiment of a planar metal-oxide semiconductor field-effect transistor (MOSFET)

102 having a diffusion barrier 108. The MOSFET 102 may comprise a substrate 104, a heavily doped region 106, and the diffusion barrier 108. The heavily doped region 106 may be formed in a region of the substrate 104. The heavily doped region 106 may be doped using N-type dopants or P-type dopants. The heavily doped region 106 may have a first doping concentration. The substrate 104 and the heavily doped region 106 may be formed using silicon, a III-V compound, or a II-VI compound. As an example, the substrate 104 and the heavily doped region 106 may be formed using gallium arsenide (GaAs). As another example, the substrate 104 and the heavily doped region 106 may be formed using indium gallium arsenide (InGaAs).

An inter-layer dielectric (ILD) layer 140 may be formed on a surface of the diffusion barrier 108. A plurality of components of the MOSFET 102 may be located within the ILD layer 140. For example, the channel region 110 may be formed on the surface of the diffusion barrier 108. The channel region 110 may be formed using an III-V compound or a II-VI compound. For example, the channel region 110 may be formed using GaAs. As another example, the channel region 110 may be formed using InGaAs. The channel region 110 may have a band gap energy based on the material used to form the channel region 110. For example, when the channel region 110 is formed using GaAs, the channel region 110 may have a band gap energy of 1.424 electron volts (eVs). The channel region 110 may be undoped or have a second doping concentration that is lower than the first doping concentration. The channel region 110 and the heavily doped region 106 may be formed according to a particular super sharp retrograde doping profile (e.g., the channel region 110 and the heavily doped region 106 are doped according to different doping concentrations).

A source strain region 112 and a drain strain region 114 may also be located within the ILD layer 140. The source strain region 112 and the drain strain region 114 may be formed on the surface of the diffusion barrier 108 post an etching process. The MOSFET 102 may further comprise a first lightly doped drain (LDD) region 116 and a second LDD region 118. The first LDD region 116 may be adjacent to the source strain region 112, and the second LDD region 118 may be adjacent to the drain strain region 114.

A dielectric layer 120 may be formed on a surface of the channel region 110. The dielectric layer 120 may cover a region of the first LDD region 116, a region of the second LDD region 118, and the surface of the channel region 110. A metal gate 122 may be formed on a surface of the dielectric layer 120. The metal gate 122 may be adjacent to a first spacer 124 and adjacent to a second spacer 126. A first active or fin stopper 132 may be adjacent to the source region 112. A second active or fin stopper 134 may be adjacent to the drain region 114. A cap film layer 142 may be formed on a surface of the ILD layer 140 such that the cap film layer 142 is adjacent to the metal gate 122. A first contact 128 may be formed on a surface of the source strain region 112. The first contact 128 may extend from the source strain region 112 and through the cap film layer 142. A second contact 130 may be formed on a surface of the drain strain region 114. The second contact 130 may extend from the drain strain region 114 and through the cap film layer 142.

The diffusion barrier 108 may be formed on a surface of the heavily doped region 106. The diffusion barrier 108 may be formed using a III-V compound. As an example, the diffusion barrier 108 may be formed using AlAs. As another example, the diffusion barrier 108 may be formed using InAlAs. Other exemplary III-V compounds may comprise Indium phosphide (InP), Aluminum antimonide (AlSb), Aluminum gallium antimonide (AlGaSb), Cadmium Aluminum Tellurium (CaAlTe), Zinc Cadmium Tellurium (ZnCdTe), etc. As another example, the diffusion barrier 108 may be formed using a II-VI compound. The diffusion barrier 108 may have a band gap energy based on the material used to form the diffusion barrier 108. For example, when the diffusion barrier 108 is formed using AlAs. The first band gap energy may be 2.16 eVs.

The diffusion barrier 108 may trap dopants from the heavily doped region 106 at a lower interface 136 and/or at an upper interface 138. The lower interface 136 may be a surface of the diffusion barrier 108 that is adjacent to the heavily doped region 106. The upper interface 138 may be another surface of the diffusion barrier 108 that is adjacent to a channel region 110 of the MOSFET 102. When the heavily doped region 106 is formed using silicon (e.g., when the substrate 104 is a silicon substrate), the diffusion barrier 108 may trap dopants from the heavily doped region 106 at the upper interface 138. When the heavily doped region 106 is formed using GaAs or InGaAs, the diffusion barrier 108 may trap the dopants at the lower interface 136. Thus, the amount of dopants that diffuse into the channel region 110 from the heavily doped region 106 may be reduced as compared to a MOSFET manufactured based on a super sharp retrograde doping profile but without a diffusion barrier.

The MOSFET 102 may also comprise a back gate contact 144 that is coupled to the heavily doped region 106. The back gate contact 144 may be adjacent to a first shallow trench isolation (STI) 146. The first STI 146 may isolate the back gate contact 144 from the diffusion barrier 108. The back gate contact 144 may extend from the heavily doped region 106 and through the ILD layer 140 and the cap film layer 142. When a voltage is applied to the heavily doped region 106 via the back gate contact 144, the heavily doped region 106 may serve as a back gate (e.g., a second gate) of the MOSFET 102. A threshold voltage of the MOSFET 102 may be controlled by biasing the metal gate 122 and the heavily doped region 106 independently. Using the heavily doped region 106 as a back gate may enable enhanced control of the threshold voltage as compared to controlling the threshold voltage via a single gate because the back gate provides an additional degree of control of the threshold voltage. Thus, the MOSFET 102 may provide enhanced threshold voltage control and reduced dopant diffusion.

During operation, a threshold voltage is applied to the metal gate 122 (e.g., via a gate contact) to turn on the MOSFET 102. Current flows from the source strain region 112 to the drain strain region 114. When the MOSFET 102 is to be turned off, the threshold voltage is turned off and current does not flow from the source strain region 112 to the drain strain region 114.

Figure 2:
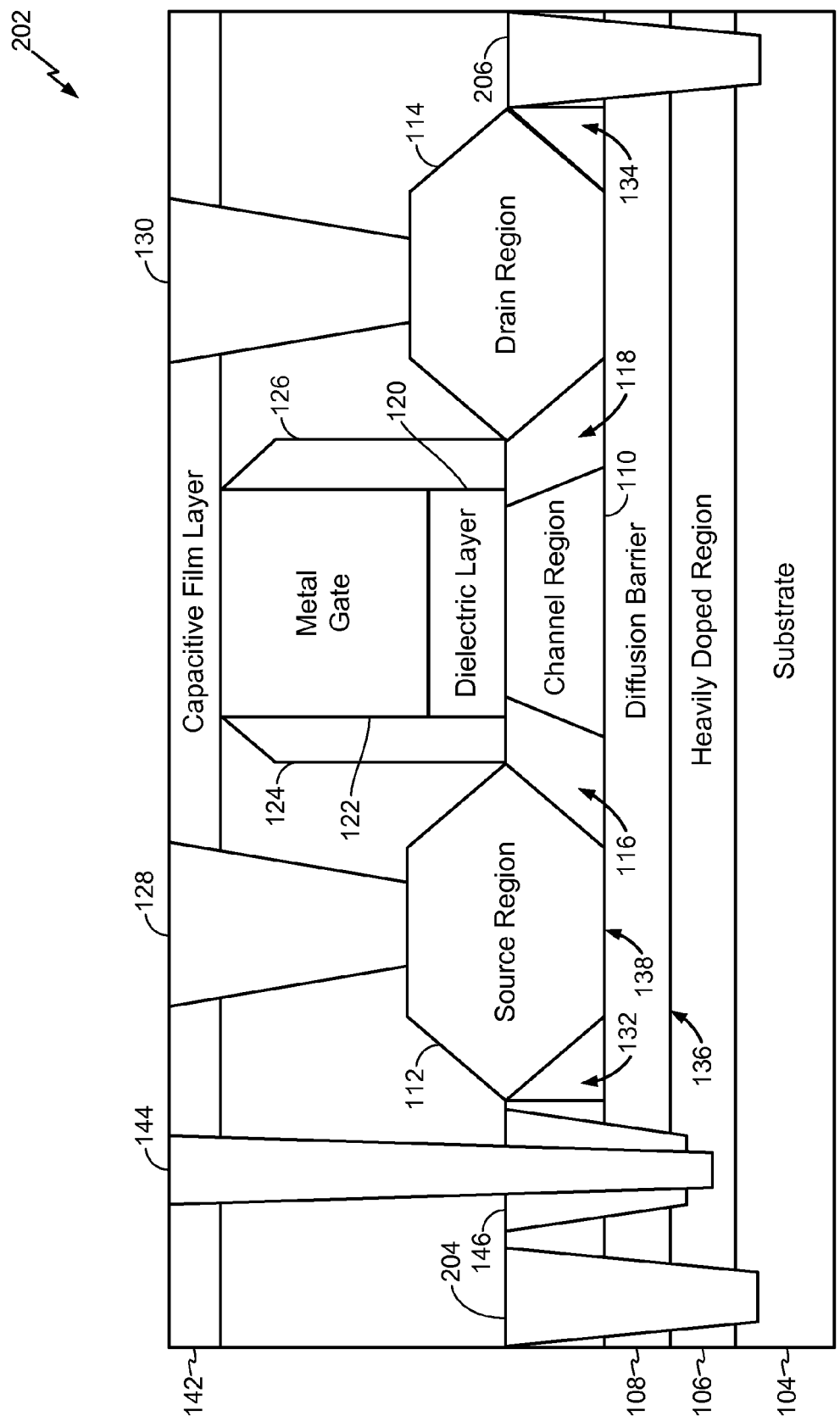
FIG. 2 is a diagram that illustrates another particular embodiment of a planar MOSFET having a diffusion barrier in a planar configuration.

FIG. 2 is a diagram that illustrates another particular embodiment of a planar MOSFET 202 having a diffusion barrier. The MOSFET 202 may be substantially similar to the MOSFET 102 of FIG. 1. The MOSFET 202 may comprise all of the components of the MOSFET 102. Further, the MOSFET 202 may comprise a second STI 204 and a third STI 206. The second STI 204 may be adjacent to the first STI 146. The second STI 204 may extend from the substrate 104 and through the heavily doped region 106 and the diffusion barrier 108. The third STI 206 may be adjacent to the second active or fin stopper 134. The third STI 206 may extend from the substrate 104 and through the heavily doped region 106 and the diffusion barrier 108. In addition to using the first active or fin stopper 132 and the second active or fin stopper 134 to reduce parasitic leakage of the MOSFET 202, the second STI 204 and the third STI 206 may further reduce the parasitic leakage of the MOSFET 202.

Figure 3:
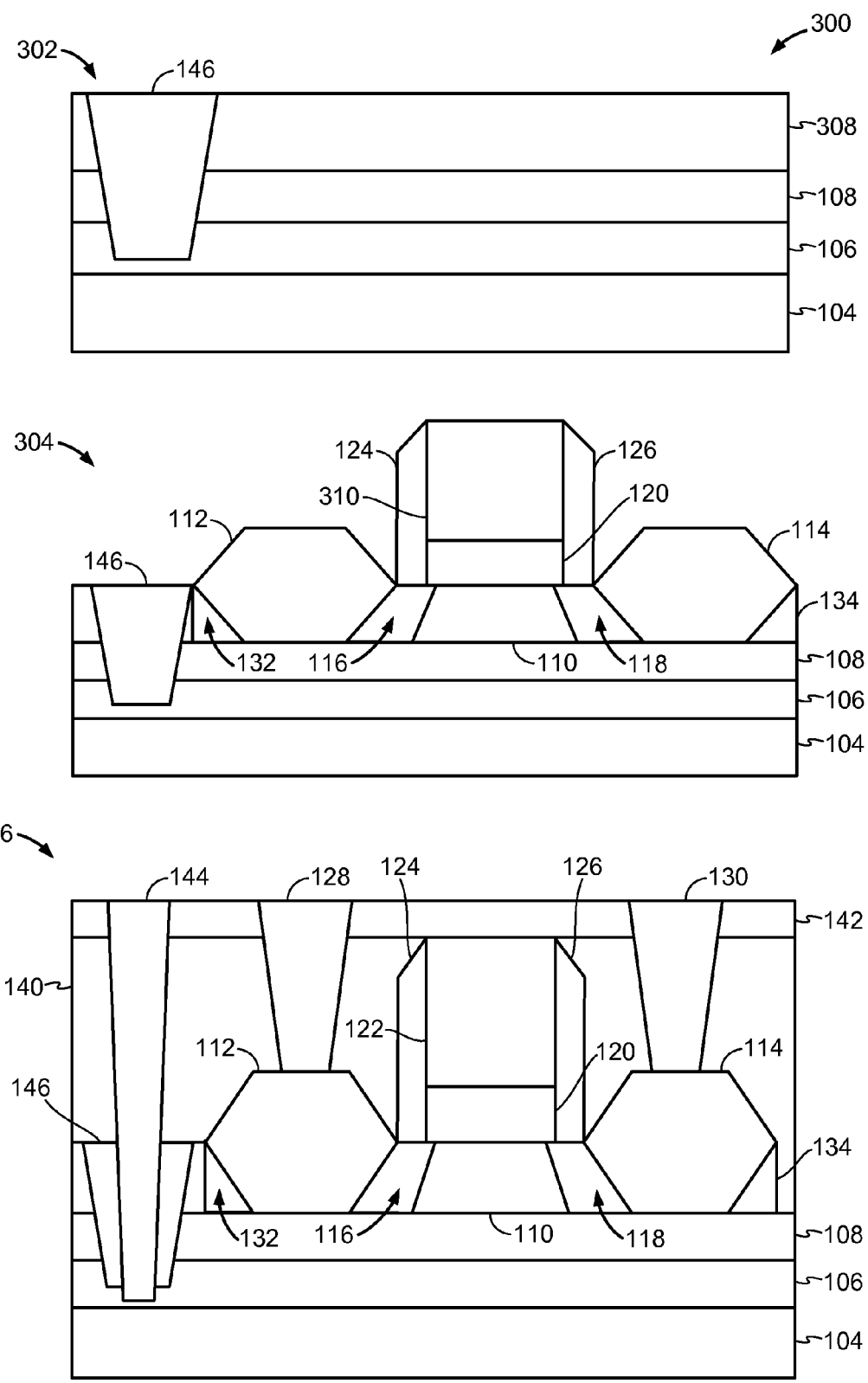
FIG. 3 is a diagram that illustrates a particular embodiment of a portion of a gate last process to manufacture a planar MOSFET having a diffusion barrier.

FIG. 3 is a diagram that illustrates a particular embodiment of a portion of a gate last process 300 (e.g., a gate of a MOSFET is manufactured subsequent to formation of a source region and a drain region of the MOSFET) to manufacture a planar MOSFET (e.g., the MOSFET 102 of FIG. 1) having a diffusion barrier. At a first processing stage 302, the heavily doped region 106 may be formed in a region of the substrate 104 via a doping process. N-type dopants or P-type dopants may be implanted into the region of the substrate 106 to form the heavily doped region 106. The N-type dopants or the P-type dopants may be implanted according to a first doping concentration. For example, the first doping concentration may be approximately $1 \times 10^{20}$ l/cm$^2$.

The diffusion barrier 108 may be formed on the surface of the heavily doped region 106 via epitaxial growth. For example, a III-V film (e.g., an AlAs film, an InAlAs film, etc.) may be grown on the surface of the heavily doped region 106 by using a low temperature (e.g., less than 300 degree Celsius) epitaxial growth process to form the diffusion barrier 108. The use of the low temperature epitaxial growth process may reduce dopant diffusion from the heavily doped region 106 as compared to a conventional silicon transistor, where a high temperature (e.g., greater than 500 degree Celsius) may be used to form a channel region on a surface of the heavily doped region 106. The higher the temperature, the greater amount of dopant may diffuse from the heavily doped region 106. A film layer 308 may be formed on the surface of the diffusion barrier 108 via epitaxial growth (e.g., a low temperature epitaxial growth process). The film layer 308 may be made from a III-V compound (e.g., GaAs, InGaAs, etc.) or a II-VI compound. The film layer 308 may be undoped or may have a second doping concentration that is lower than the first doping concentration. In addition, the film layer 308 may have a lower band gap energy (e.g., energy gap between valance band to conductance band) than the diffusion barrier 108 so that the diffusion barrier 108 may serve as a dopant diffusion barrier of the heavily doped region 106. In III-V and II-VI material systems, the higher energy band gap of the diffusion barrier 108 may help to form an effective backgate.

The first STI 146 may be formed via an etching process. For example, regions of the film layer 308, the diffusion barrier 108, and the heavily doped region 106 may be etched to form a trench. The first STI 146 may be formed in the trench via an oxide film deposition process and a CMP process.

At a second processing stage 304, a dielectric film having a high dielectric constant ("high-k") (as compared to silicon dioxide) may be deposited on the surface of the film layer 308 and patterned to form the dielectric layer 120. A poly-silicon film may be deposited on a surface of the dielectric layer 120 and patterned to form a poly-silicon gate 310. LDD implants may be implanted into regions of the film layer 308 via a halo implantation process. A spacer film (e.g., an SiN film) may be deposited adjacent to the poly-silicon gate 310 and the dielectric layer 120. The spacer film may be etched to form the first spacer 124 and the second spacer 126.

Also at the second processing stage 304, ion implants may be implanted into regions of the LDD implanted regions of the film layer 308. After annealing the ion implanted regions, the ion implanted regions may be etched and stressors may be formed on the etched regions via an epitaxial growth process to form the source strain region 112 and the drain strain region 114. Salicide (not shown) may also be formed on the source region 112 and the drain region 114. A region of the film layer 308 that is between the ion implanted regions may become the channel region 110. A first region of the ion implanted regions that are between the source strain region 112 and the channel region 308 may become the first LDD region 116. A second region of the ion implanted regions that is between the drain strain region 114 and the channel region 308 may become the second LDD region 118. A first edge region of the film layer 308 may be defined by the source strain region 112 to form the first active edge 132. A second edge region of the film layer 308 may be defined by the drain strain region 114 to form the active edge 134.

At a third processing stage 306, an ILD film may be deposited on the surfaces of the diffusion barrier 108, the active edge 132, 134, the source strain region 112, the drain strain region 114, the spacers 124, 126, and the poly-silicon gate 310 to form the ILD layer 140. A chemical-mechanical planarization (CMP) process may be applied to the ILD layer 140 to expose a surface of the poly-silicon gate 310. The poly-silicon gate 310 may be removed via an etching process to form a trench between the spacers 124, 126. A metal film may be deposited into the trench to form the metal gate 122. A CMP process may be applied to a surface of the metal gate 122 so that the surface may be level with a surface of the ILD layer 140. A cap film may be deposited on the surface of the ILD layer 140 and the surface of the metal gate 122 to form the cap film layer 142. The back gate contact 144 may be formed via an etching process and a metal film deposition process and CMP. Thus, the MOSFET 102 of FIG. 1 may be formed using the gate last process 300.

Figure 4:
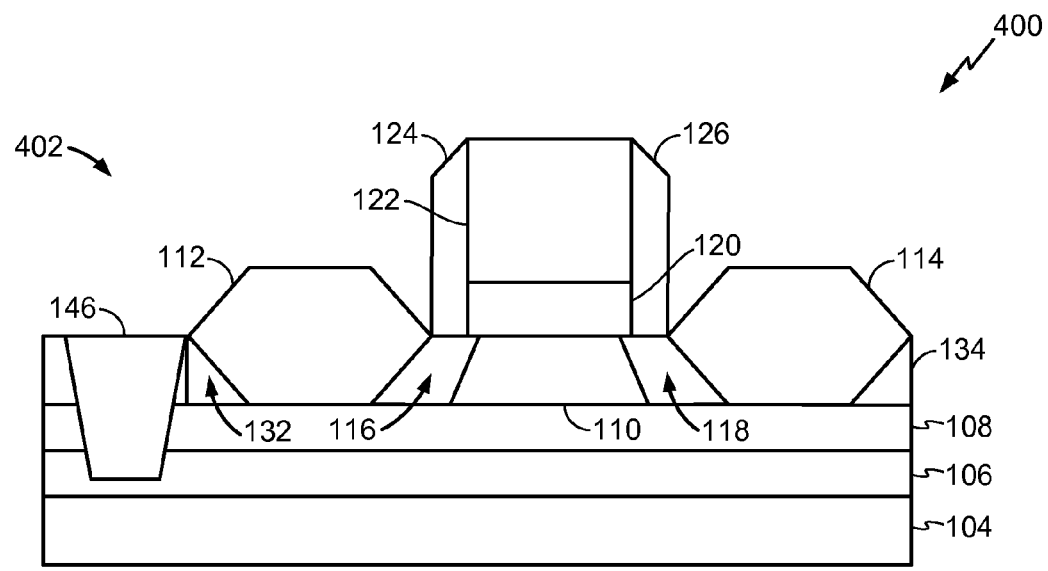
FIG. 4 is a diagram that illustrates a particular embodiment of a portion of a gate first process to manufacture a planar MOSFET having a diffusion barrier.
Figure 4:
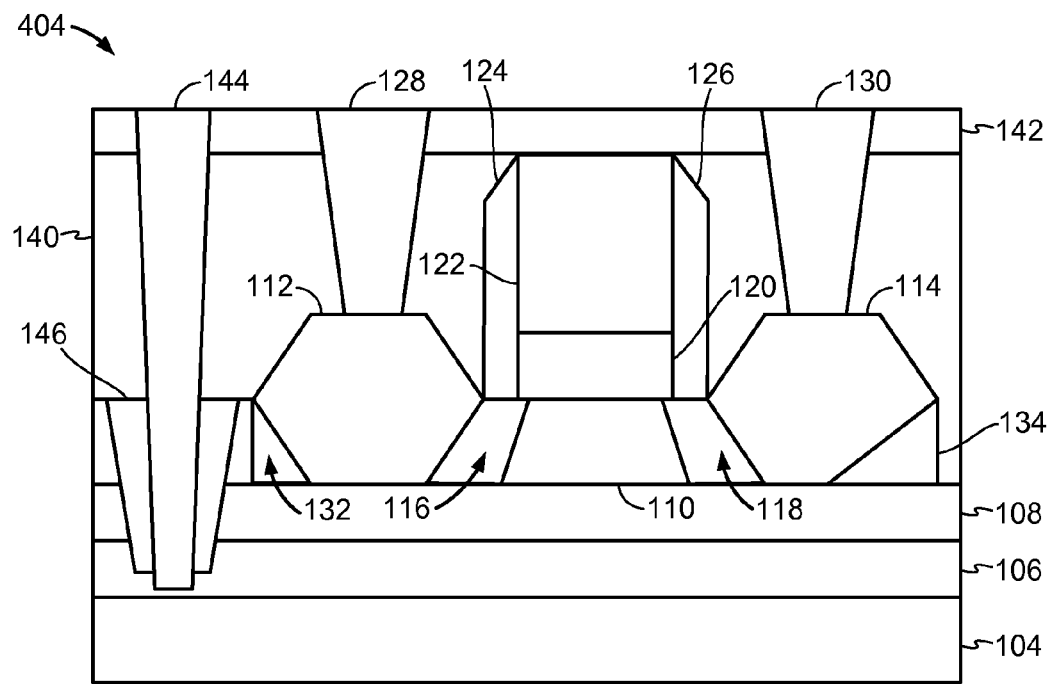

FIG. 4 illustrates a particular embodiment of a portion of a gate first process 400 (e.g., a gate of a MOSFET is manufactured prior to formation of a source region and a drain region of the MOSFET) to manufacture a planar MOSFET (e.g., the MOSFET 102 of FIG. 1) having a diffusion barrier. At a first processing stage 402, a dielectric film (e.g., a high-k dielectric film) may be deposited on a surface of a film layer (e.g., the film layer 308 of FIG. 3) to form the dielectric layer 120. A metal film may be deposited on a surface of the dielectric layer 120 and patterned to form the metal gate 122. Also the first STI 146 may also be formed via an etching process and an oxide deposition and CMP process. At a second processing stage 404, subsequent to formation of the metal gate 122, other components (e.g., the source strain region 112, the drain strain region 114, the channel region 110, the spacers 124, 126, the active edge 132, 134, the LDD regions 116, 118, the contacts 128, 130, the ILD layer 140, the back gate contact 144, and the cap film layer 142) of the MOSFET 102 may be formed as described with reference to FIG. 3. Thus, the MOSFET 102 of FIG. 1 may be formed using the gate first process 400.

Figure 5:
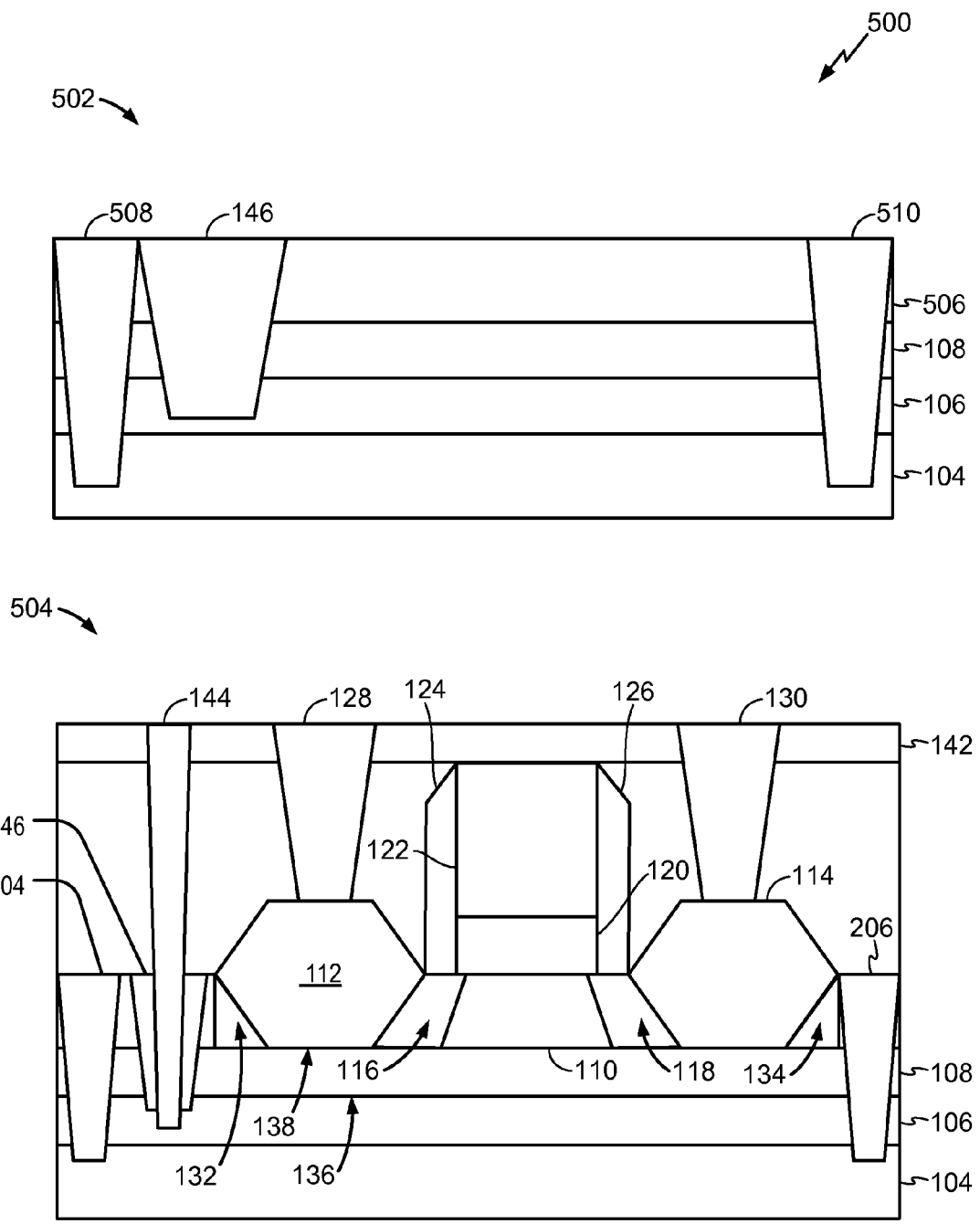
FIG. 5 is a diagram that illustrates a particular embodiment of a portion of a process to manufacture a shallow trench isolation stopper of a planar MOSFET having a diffusion barrier.

FIG. 5 illustrates a particular embodiment of a portion of a process 500 to manufacture a planar MOSFET (e.g., the MOSFET 202 of FIG. 2) having a diffusion barrier. At a first processing stage 502, a film layer 506 may be deposited on a surface of the diffusion barrier 108. The film layer 506 may be similar to the film layer 308 of FIG. 3. Regions of the substrate 104, the heavily doped region 106, the diffusion barrier 108, and the film layer 506 may be etched to form a first trench 508 and a second trench 510. Oxide film may be deposited into the trenches 508 and 510 and CMP to form the STI 204, 206. At a second processing stage 504, other components (e.g., the metal gate 122, the source strain region 112, the drain strain region 114, the channel region 110, the spacers 124, 126, the active edge 132, 134, the LDD regions 116, 118, the contact 128, 130, the back gate contact 144, and the cap film layer 142) of the MOSFET 202 may be formed as described with reference to FIG. 3 when a gate last manufacturing process is used. The other components may be formed as described with reference to FIG. 4 when a gate first manufacturing process is used. Thus, the MOSFET 202 of FIG. 2 may be formed using the process 500.

Figure 6:
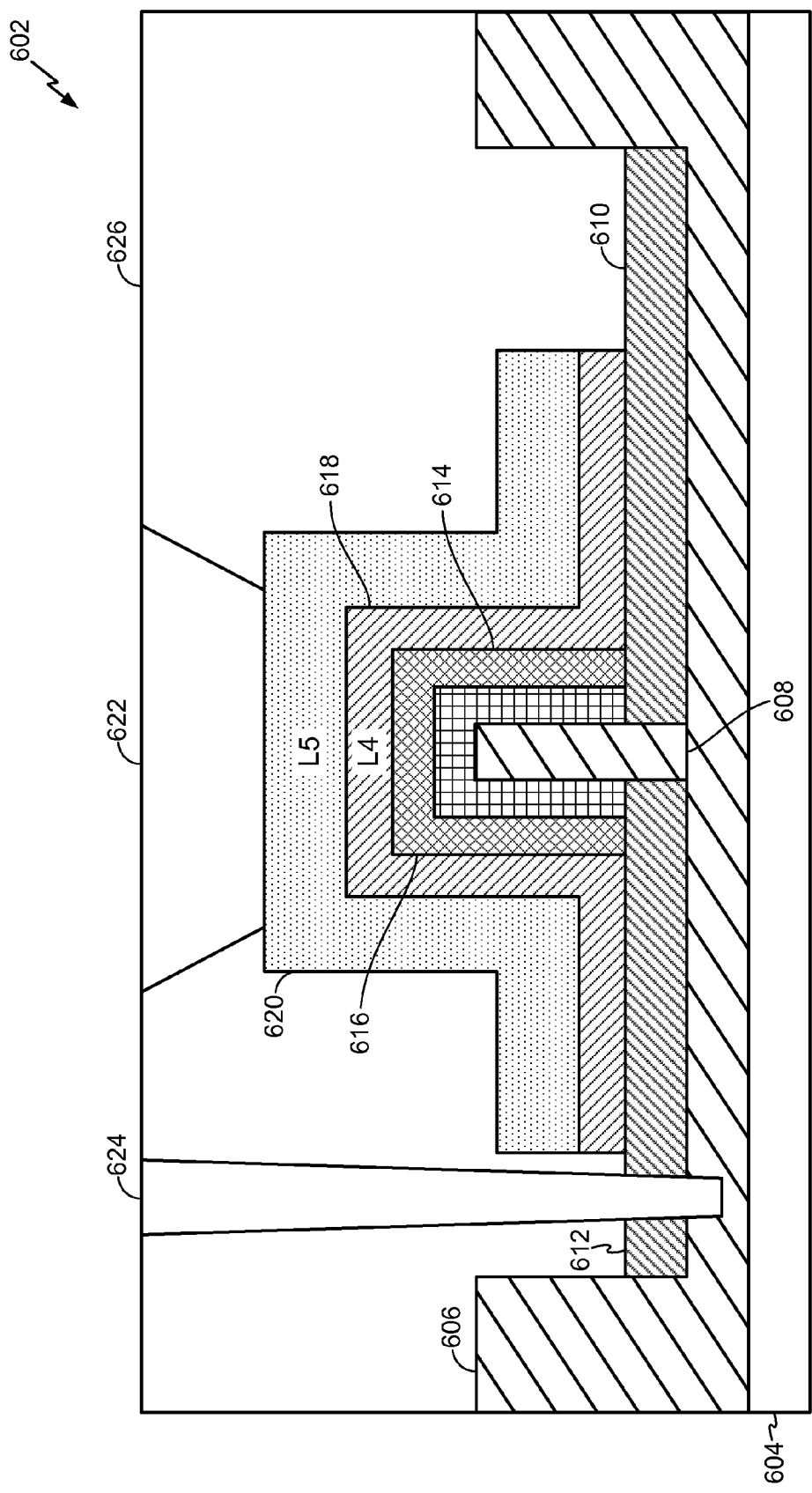
FIG. 6 is a diagram that illustrates a particular embodiment of a fin field-effect transistor (FinFET) having a diffusion barrier.

FIG. 6 illustrates a particular embodiment of a fin field-effect transistor (FinFET) 602 having a diffusion barrier. The FinFET 602 may function similarly to the MOSFET 102 of FIG. 1 and/or the MOSFET 202 of FIG. 2 in that the FinFET 602 may have a diffusion barrier 614 to reduce dopant diffusions from a heavily doped region 606 to a channel region 616. The FinFET 602 may comprise a substrate 604 and the heavily doped region 606. The FinFET 602 may also comprise a fin 608 that is adjacent to STI 610 and 612. The fin 608 may be formed as a part of the heavily doped region 606. The FinFET 602 may further comprise a diffusion barrier 614 adjacent to the fin 608 and the channel region 616 adjacent to the diffusion barrier 614. The diffusion barrier 614 may be substantially similar to the diffusion barrier 108 of FIG. 1. The channel region 616 may be substantially similar to the channel region 110 of FIG. 1. The diffusion barrier 614 may reduce dopant diffusions from the fin 608 to the channel region 616.

A dielectric layer 618 of the FinFET 602 may be adjacent to the channel region 616. The dielectric layer 618 may be formed using a material with a high dialectic constant ("high-k"). A metal gate 620 of the FinFET 602 may be adjacent to the dielectric layer 618. The FinFET 602 may further comprise a metal gate contact 622 that is in contact with the metal gate 620. The FinFET 602 may further comprise a back gate contact 624 that extends from the heavily doped region 606. When a voltage is applied to the heavily doped region 606 via the back gate contact 624, the heavily doped region 606 may serve as a second gate (e.g., a back gate) of the FinFET 602. The FinFET 602 may further comprise an oxide layer 626 that is in contact with the metal gate contact 622, a source region (not shown), and a drain region (not shown).

Figure 7:
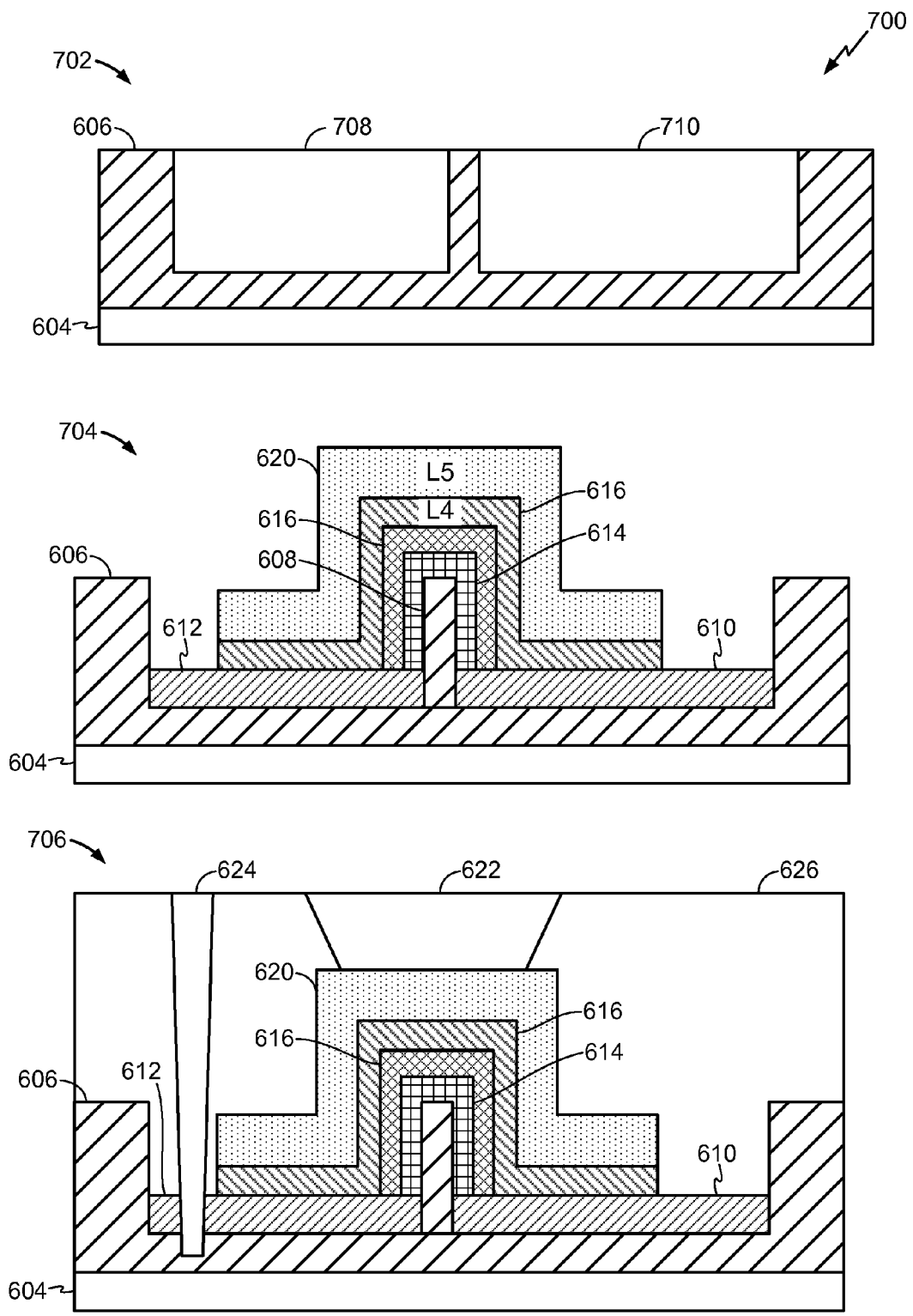
FIG. 7 is a diagram that illustrates a particular embodiment of a portion of a process to manufacture a FinFET having a diffusion barrier.

FIG. 7 illustrates a particular embodiment of a portion of a process 700 to manufacture a FinFET (e.g., the FinFET 602 of FIG. 6) having a diffusion barrier. At a first processing stage 702, the heavily doped region 606 may be formed in a region of the substrate 604 via a doping process. The substrate 604 and the heavily doped region 606 may be formed using silicon, a III-V compound, or a II-VI compound. As an example, the substrate 604 and the heavily doped region 606 may be formed using gallium arsenide (GaAs). As another example, the substrate 604 and the heavily doped region 606 may be formed using indium gallium arsenide (InGaAs). N-type dopants or P-type dopants may be implanted into a region of the substrate 604 to form the heavily doped region 606. The N-type dopants or the P-type dopants may be implanted according to a first doping concentration. Regions of the heavily doped region 606 may be etched to form trenches. Oxide films may be deposited into the trenches to form the STI regions 708 and 710. Surfaces of the STI regions 708 and 710 and the heavily doped region 606 may be flattened via a chemical-mechanical planarization (CMP) process.

At a second processing stage 704, the STI regions 708 and 710 may be etched to form the STI 610 and 612 and the fin 608. The diffusion barrier 614 may be formed on a surface of the fin 608 via epitaxial growth. The diffusion barrier 614 may be formed using the same material as the diffusion barrier 108 of FIG. 1. The channel region 616 may be formed on a surface of the diffusion barrier 614 via epitaxial growth. The channel region 616 may be formed using the same material as the channel region 110 of FIG. 1. Subsequent to the formation of the channel region 616, the dielectric layer 618 may be formed on a surface of the channel region 616 via deposition. The metal gate 620 may be formed on a surface of the dielectric layer 618.

At a third processing stage 706, a dielectric film may be deposited on the surfaces of the metal gate 620, the dielectric layer 618, the heavily doped region 606, and the STI 610 and 612 to form the oxide layer 626. A top surface of the dielectric layer 626 may be flattened via a CMP process. A region of the dielectric layer 626 may be etched to form a first trench. A metal film may be deposited into the first trench to form the metal gate contact 622. Regions of the oxide layer 626, the STI 612, and the heavily doped region 606 may be etched to form a second trench. A metal film may be deposited into the second trench to form the back gate contact 624. A source region (not shown) and a drain region (not shown) may also be formed at the third processing stage 706. With regards to FIG. 6, the source region and the drain region may be perpendicular to the plane of the device illustrated by FIG. 6. The source region and the drain region may be formed at the fin 602. The source region and the drain region may be etched and stressors may be formed from FinFET 602. Thus, the FinFET 602 of FIG. 6 may be formed using the process 700.

Figure 8:
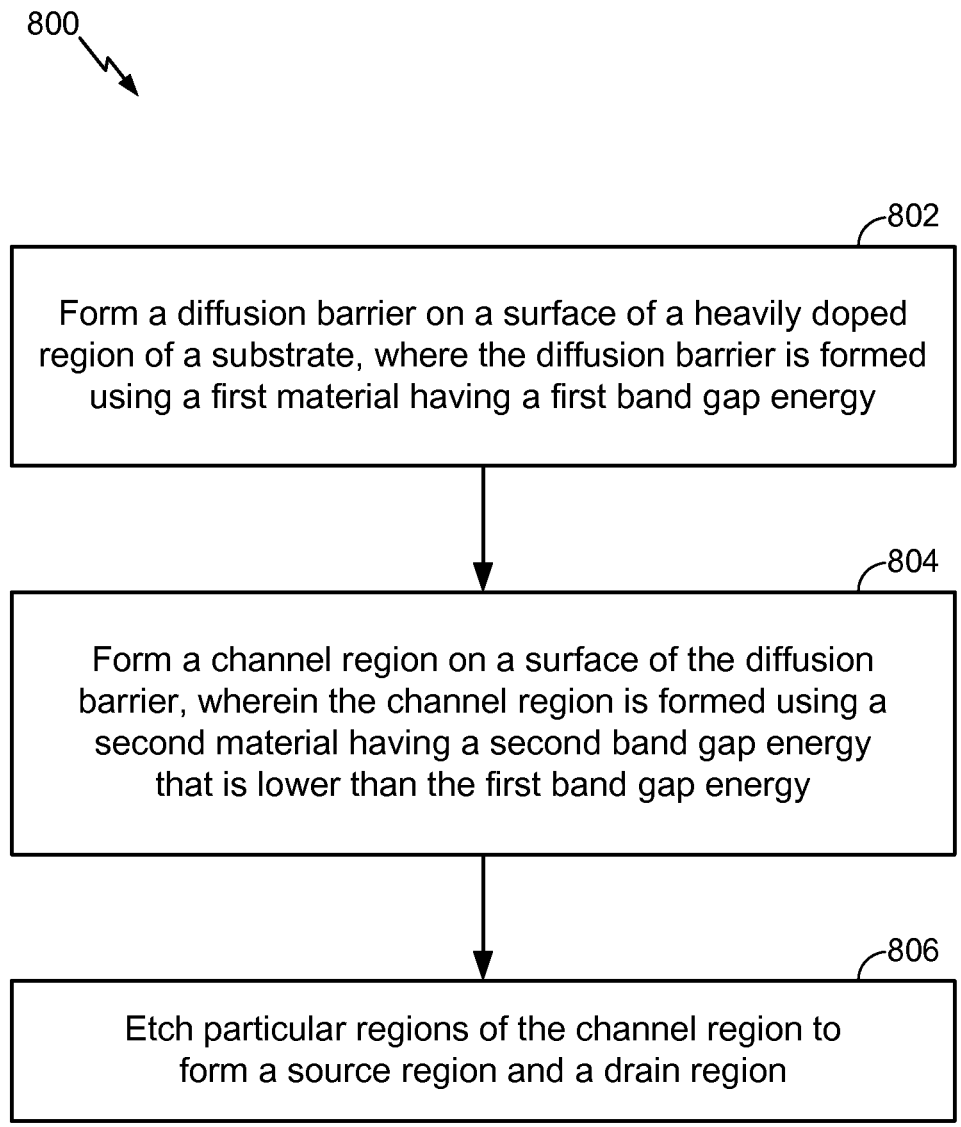
FIG. 8 is a flow chart to illustrate a particular embodiment of a method of fabricating a transistor having a diffusion barrier.

FIG. 8 is a flow chart to illustrate a particular embodiment of a method 800 of fabricating a transistor (e.g., the MOSFET 102 of FIG. 1, the MOSFET 202 of FIG. 2, or the FinFET 602 of FIG. 6) having a diffusion barrier. The method 800 comprises forming a diffusion barrier on a surface of a heavily doped region of a substrate, where the diffusion barrier is formed using a first material having a first band gap energy, at 802. For example, referring to FIG. 3, the diffusion barrier 108 may be formed on the surface of the heavily doped region 106 via epitaxial growth. The method 800 also comprises forming a channel region on a surface of the diffusion barrier, where the channel region is formed using a second material having a second band gap energy that is lower than the first band gap energy, at 804. For example, referring to FIG. 3, a region of the film layer 308 that is between the ion implanted regions may become the channel region 110. The method 800 further comprises etching particular regions of the channel region to form a source region and a drain region, at 806. For example, referring to FIG. 3, after annealing the ion implanted regions, the ion implanted regions may be etched and stressors may be formed on the etched regions via an epitaxial growth process to form the source strain region 112 and the drain strain region 114. In a particular embodiment, the method 800 further comprises forming a back gate contact coupled to the heavily doped region. For example, referring to FIG. 3, the back gate contact 144 may be formed via an etching process.

In another particular embodiment, the method 800 further comprises forming a dielectric layer on a surface of the channel region. For example, referring to FIG. 3, an ILD film may be deposited on the surfaces of the diffusion barrier 108, the active edge 132, 134, the source strain region 112, the drain strain region 114, the spacers 124, 126, and the poly-silicon gate 310 to form the ILD layer 140. The method 800 further comprises forming a metal gate on a surface of the dielectric layer. For example, referring to FIG. 4, a dielectric film (e.g., a high-k dielectric film) may be deposited on a surface of a film layer (e.g., the film layer 308 of FIG. 3) to form the dielectric layer 120. A metal film may be deposited on a surface of the dielectric layer 120 and patterned to form the metal gate 122. The method 800 further comprises forming a first shallow trench isolation (STI) region on a first surface of the substrate and a second STI region on a second surface of the substrate, where the first STI region and the second STI region are formed via an etching process, and where the first STI region is adjacent to the source region and the second STI region is adjacent to the drain region. For example, referring to FIG. 5, regions of the substrate 104, the heavily doped region 106, the diffusion barrier 108, and the film layer 506 may be etched to form a first trench 508 and a second trench 510. Oxide film may be deposited into the trenches 508 and 510 to form the STI 204, 206. Thus, the method 800 may enable a transistor doped based on a super sharp retrograde profile with a diffusion barrier to be manufactured. The diffusion barrier may reduce dopant diffusions from a heavily doped region of the transistor to a channel region of the transistor as compared to a transistor without a diffusion barrier.

Figure 9:
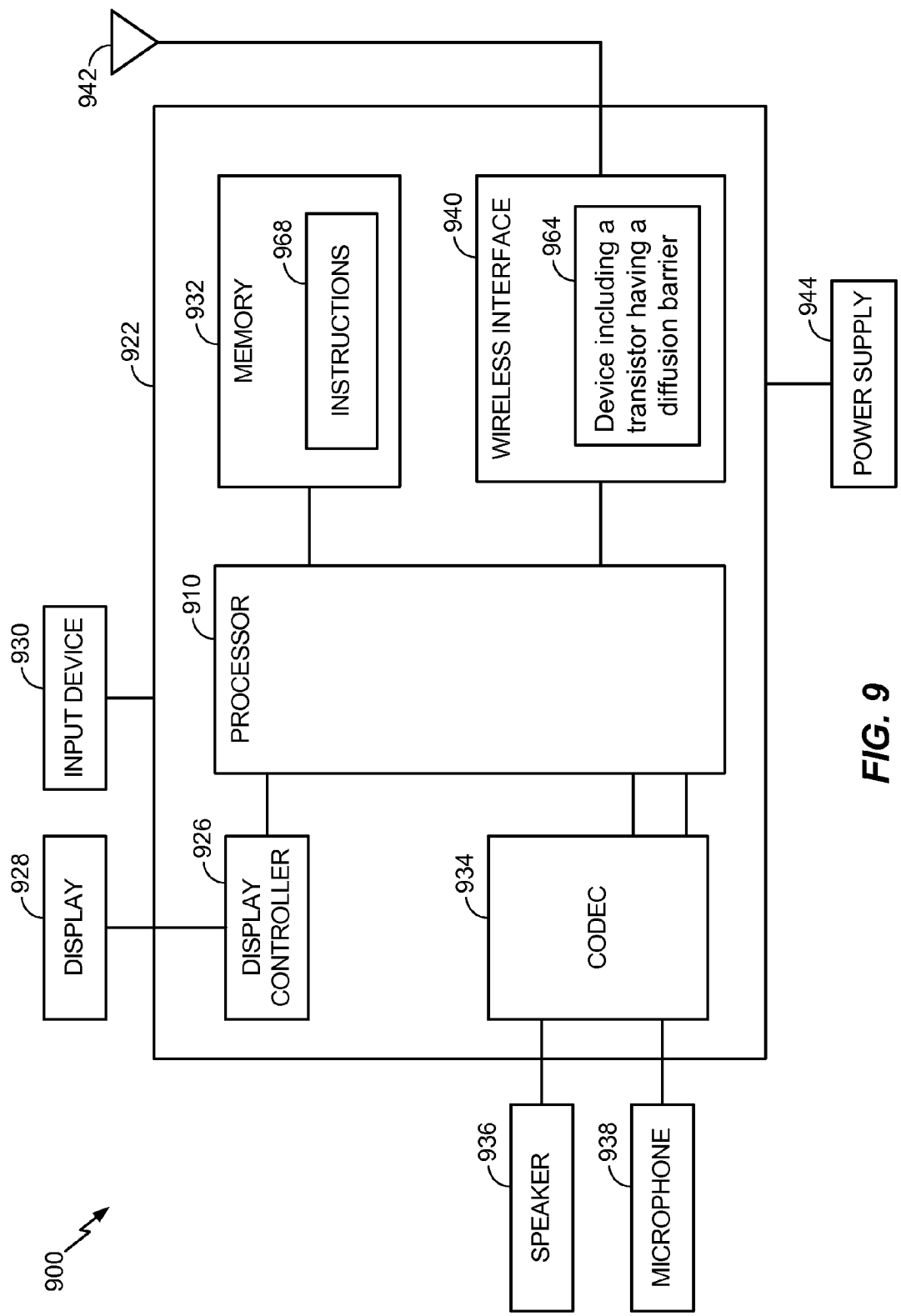
FIG. 9 is a diagram of a particular embodiment of a communication device that comprises a transistor having a diffusion barrier.

FIG. 9 is a diagram of a particular embodiment of a communication device 900 that comprises a transistor (e.g., the MOSFET 102 of FIG. 1, the MOSFET 202 of FIG. 2, the FinFET 602 of FIG. 6) having a diffusion barrier (e.g., the diffusion barrier 108 of FIG. 1). The device 900 includes a processor 910 (e.g., a digital signal processor (DSP), a central processing unit (CPU), etc.) coupled to a memory 932. The memory 932 includes instructions 968 (e.g., executable instructions) such as computer-readable instructions that are readable by the processor 910. The instructions 968 may include one or more instructions that are executable by a computer, such as the processor 910.

FIG. 9 also shows a display controller 926 that is coupled to the processor 910 and to a display 928. A coder/decoder (CODEC) 934 can also be coupled to the processor 910. A speaker 936 and a microphone 938 can be coupled to the CODEC 934.

FIG. 9 also indicates that a wireless interface 940 can be coupled to the processor 910 and to an antenna 942. The wireless interface 940 may include a wireless controller, a wireless transceiver, such as a receiver circuit, a transmitter circuit, or a combination thereof. In a particular embodiment, the wireless interface 940 includes a device 964 that includes a transistor having a diffusion barrier (e.g., the MOSFET 102 of FIG. 1, the MOSFET 202 of FIG. 2, and the FinFET 602 of FIG. 6). In an alternative embodiment, the device 964 may be located in one or more components of the device 900 other than in the wireless interface 940. The device 964 may include an analog circuit, a digital circuit, a mixed-signal circuit, a radio frequency (RF) circuit, a clock signal generation circuit, a memory device (e.g., a dynamic random access memory (DRAM) device), another type of device, or any combination thereof.

In a particular embodiment, the processor 910, the display controller 926, the memory 932, the CODEC 934, and the wireless interface 940 are included in a system-in-package or system-on-chip device 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the wireless antenna 942, and the power supply 944 are external to the system-on-chip device 922. However, each of the display 928, the input device 930, the speaker 936, the microphone 938, the antenna 942, and the power supply 944 can be coupled to a component of the system-on-chip device 922, such as an interface or a controller.

One or more of the disclosed embodiments may be implemented in a system or an apparatus, such as the device 900, that may include a communications device, a fixed location data unit, a mobile location data unit, a mobile phone, a cellular phone, a satellite phone, a computer, a tablet, a portable computer, or a desktop computer. Additionally, the device 900 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 10:
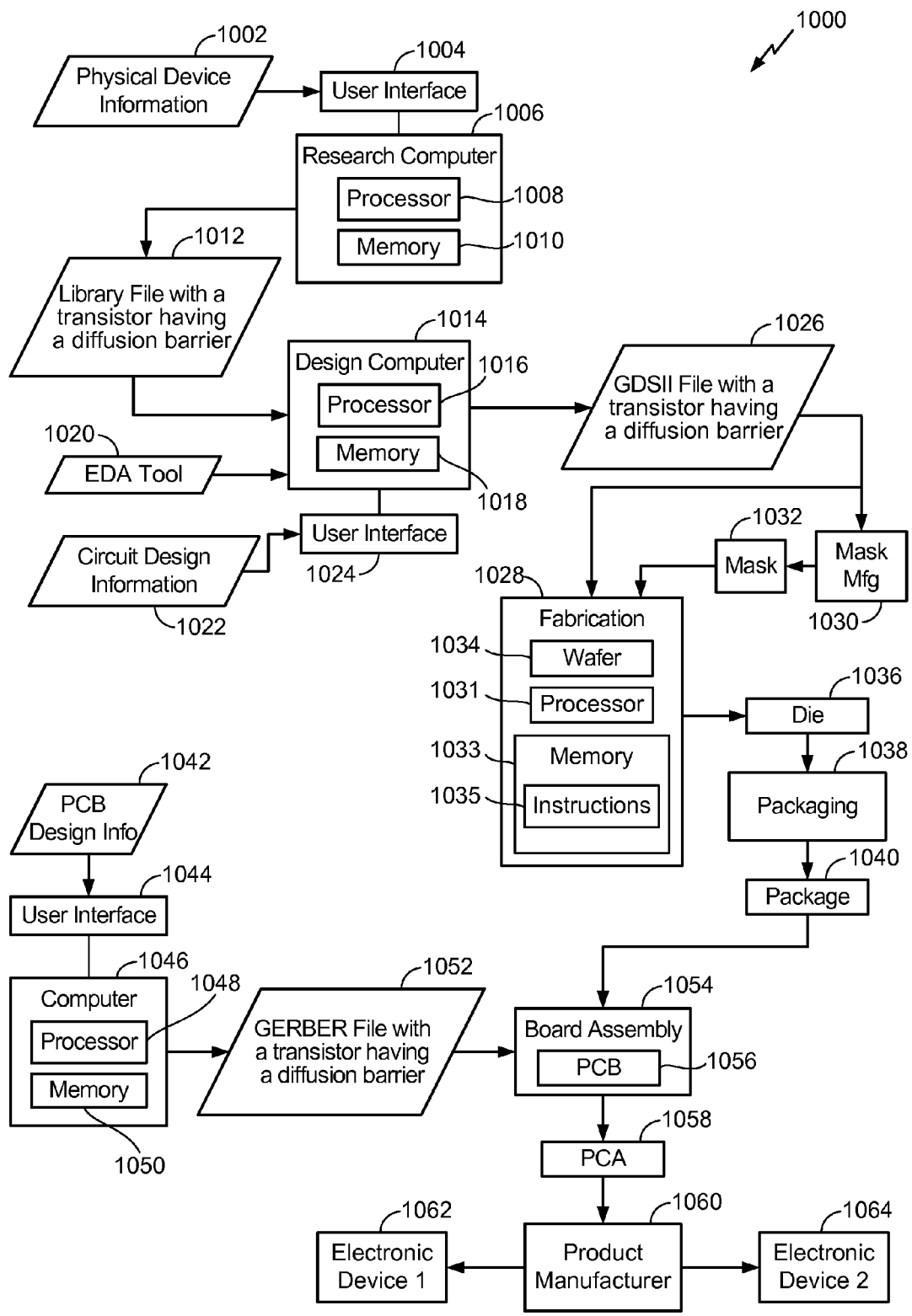
FIG. 10 is a diagram that illustrates a particular embodiment of a process to manufacture electronic devices that comprise a transistor having a diffusion barrier.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include semiconductor wafers that are then cut into semiconductor dies and packaged into one or more semiconductor chips. The chips are then employed in devices described above. FIG. 10 depicts a particular illustrative embodiment of an electronic device manufacturing process 1000.

Physical device information 1002 is received at the manufacturing process 1000, such as at a research computer 1006. The physical device information 1002 may include design information representing at least one physical property of a semiconductor device, such as a semiconductor device including a transistor having a diffusion barrier (e.g., the MOSFET 102 of FIG. 1, the MOSFET 202 of FIG. 2, and the FinFET 602 of FIG. 6). For example, the physical device information 1002 may include physical parameters, material characteristics, and structure information that is entered via a user interface 1004 coupled to the research computer 1006. The research computer 1006 includes a processor 1008, such as one or more processing cores, coupled to a computer-readable medium such as a memory 1010. The memory 1010 may store computer-readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes a transistor having a diffusion barrier (e.g., the MOSFET 102 of FIG. 1, the MOSFET 202 of FIG. 2, and the FinFET 602 of FIG. 6) and may be provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor-executable instructions at the memory 1018 to enable a user of the design computer 1014 to design a circuit including a transistor having a diffusion barrier (e.g., the MOSFET 102 of FIG. 1, the MOSFET 202 of FIG. 2, the FinFET 602 of FIG. 6) of the library file 1012. For example, a user of the design computer 1014 may enter circuit design information 1022 via a user interface 1024 coupled to the design computer 1014. The circuit design information 1022 may include design information representing at least one physical property of a semiconductor device, such as a semiconductor device that includes a transistor having a diffusion barrier (e.g., the MOSFET 102 of FIG. 1, the MOSFET 202 of FIG.

2, and the FinFET 602 of FIG. 6). To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format (e.g., a GDSII format). The design computer 1014 may be configured to generate a data file including the transformed design information, such as a GDSII file 1026 that includes information describing a transistor having a diffusion barrier (e.g., the MOSFET 102 of FIG. 1, the MOSFET 202 of FIG. 2, the FinFET 602 of FIG. 6), in addition to other circuits or information. To illustrate, the data file may include information corresponding to a system-on-chip (SOC) that includes a transistor having a diffusion barrier (e.g., the MOSFET 102 of FIG. 1, the MOSFET 202 of FIG. 2, the FinFET 602 of FIG. 6), and that may also include additional electronic circuits and components within the SOC.

The GDSII file 1026 may be received at a fabrication process 1028 to manufacture a wafer including a transistor having a diffusion barrier (e.g., the MOSFET 102 of FIG. 1, the MOSFET 202 of FIG. 2, and the FinFET 602 of FIG. 6), according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, such as a silicon on insulator (SOI) wafer, a silicon on silicon (SOS) wafer, or a bulk silicon wafer.

In a particular embodiment, the fabrication process 1028 may be initiated or controlled by a processor 1031 and a memory 1033. The memory 1033 (e.g., a non-transitory computer-readable medium) may include instructions 1035 that are executable by the processor 1031. For example, the computer-executable instructions may be executable to cause the processor 1031 to initiate or control formation of transistor having a diffusion barrier (e.g., the MOSFET 102 of FIG. 1, the MOSFET 202 of FIG. 2, and the FinFET 602 of FIG. 6). To illustrate, the instructions may be executable by the processor 1031 to initiate or control operation of one or more tools or processes that form the capacitor, components thereof, or components attached thereto (e.g., metal layer(s), insulator layer(s), vias, etc.).

The fabrication process 1028 may be performed by a fabrication system that is fully automated or partially automated. For example, the fabrication process 1028 may be automated and steps of the fabrication process 1028 may be performed according to a schedule. The fabrication system may include fabrication equipment (e.g., processing tools) to perform one or more operations to form a device, such as a transistor having a diffusion barrier (e.g., the MOSFET 102 of FIG. 1, the MOSFET 202 of FIG. 2, the FinFET 602 of FIG. 6). For example, the fabrication equipment may be configured to form a first metal layer, a first insulator layer, a second metal layer, a second insulator layer, vias connecting to the second metal layer, a passivation layer, etc.

The fabrication system (e.g., an automated system that performs the fabrication process 1028) may have a distributed architecture (e.g., a hierarchy). For example, the fabrication system may include one or more processors, such as the processor 1031, one or more memories, such as the memory 1033, and/or controllers that are distributed according to the distributed architecture. The distributed architecture may include a high-level processor that controls or initiates operations of one or more low-level systems. For example, a high-level portion of the fabrication system that controls or performs the fabrication process 1028 may include one or more processors, such as the processor 1031, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status information to the high-level system. Each of the one or more low-level systems may be associated with one or more corresponding pieces of fabrication equipment (e.g., processing tools). In a particular embodiment, the fabrication system may include multiple processors that are distributed. For example, a controller of a low-level system component of the fabrication system may include a processor, such as the processor 831.

Alternatively, the processor 1031 may be a part of a high-level system, subsystem, or component of the fabrication system. In another embodiment, the processor 1031 includes distributed processing at various levels and components of a fabrication system.

Thus, the processor 1031 may include or execute processor-executable instructions that cause the processor 1031 to initiate or control formation of a device, such as a transistor having a diffusion barrier (e.g., the MOSFET 102 of FIG. 1, the MOSFET 202 of FIG. 2, and the FinFET 602 of FIG. 6). For example, metal layer(s) may be formed by one or more deposition tools or one or more plating platforms, platers, or other plating equipment configured to form a metal plate in a device. As another example, insulator layer(s) and passivation layer(s) may be formed by one or more deposition tools or a "bottom up" fabrication tool, such as a chemical vapor deposition tool or a spin-on fabrication tool. As yet another example, openings may be formed in insulator layer(s) and passivation layer(s) by one or more etchers, such as a wet etcher, a dry etcher, or a plasma etcher, or one or more dissolving tools.

The executable instructions stored in the memory 1033 may enable the processor 1031 to initiate and control formation of a device, such as a transistor having a diffusion barrier (e.g., the MOSFET 102 of FIG. 1, the MOSFET 202 of FIG. 2, the FinFET 602 of FIG. 6), by performing operations as described by the method 800 of FIG. 8.

The die 1036 may be provided to a packaging process 1038, where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor-executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including a transistor having a diffusion barrier (e.g., the MOSFET 102 of FIG. 1, the MOSFET 202 of FIG. 2, and the FinFET 602 of FIG. 6).

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including a transistor having a diffusion barrier (e.g., the MOSFET 102 of FIG. 1, the MOSFET 202 of FIG. 2, the FinFET 602 of FIG. 6). In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer, into which a transistor having a diffusion barrier (e.g., the MOSFET 102 of FIG. 1, the MOSFET 202 of FIG. 2, the FinFET 602 of FIG. 6) is integrated. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes a transistor having a diffusion barrier (e.g., the MOSFET 102 of FIG. 1, the MOSFET 202 of FIG. 2, the FinFET 602 of FIG. 6), may be fabricated, processed, and incorporated into an electronic device, as described in the illustrative process 1000. One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1033 of a computer associated with the fabrication process 1028, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

In conjunction with the described embodiments, an apparatus may include means for blocking dopant diffusion, where the means for blocking dopant diffusion is formed on a surface of a heavily doped region of a substrate, and where the means for blocking dopant diffusion is formed using a first material having a first band gap energy. For example, the means for blocking dopant diffusion may include the diffusion barrier 108 of FIG. 1, the diffusion barrier 614 of FIG. 6, one or more other devices configured to block dopant diffusion, or any combination thereof.

The apparatus may also include means for providing a conduction channel, where the means for providing a conduction channel is formed on a surface of the means for blocking dopant diffusion, and where the means for providing a conduction channel is formed using a second material having a second band gap energy that is lower than the first band gap energy. For example, the means for providing a conduction channel may include the channel region 110 of FIG. 1, the channel region 616 of FIG. 6, one or more other devices configured to provide a conduction channel, or a combination thereof.

The apparatus may further include means for providing a back gate contact, where the means for providing a back gate contact is coupled to a first region of the substrate. For example, the means for providing a back gate contact may include the back gate contact 144 of FIG. 1, the back gate contact 624 of FIG. 6, one or more other devices configured to provide a back gate contact, or a combination thereof.

Although one or more of FIGS. 1-10 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry. Embodiments of the disclosure may also be employed in a standalone device (e.g., a standalone transistor).

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor-executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a substrate;
   a diffusion barrier formed on a surface of a first region of the substrate, wherein the diffusion barrier is formed using a first material having a first band gap energy;
   a channel region formed on a surface of the diffusion barrier, wherein the channel region is formed using a second material having a second band gap energy that is lower than the first band gap energy; and
   a back gate contact coupled to the first region of the substrate, the back gate contact extending into the first region of the substrate.

2. The apparatus of claim 1, wherein the first region has a higher doping concentration than the channel region.

3. The apparatus of claim 1, wherein the first material comprises a III-V compound or a II-VI compound.

4. The apparatus of claim 1, wherein the first material comprises aluminum arsenide or indium aluminum arsenide.

5. The apparatus of claim 1, wherein the second material comprises gallium arsenide or indium gallium arsenide.

6. The apparatus of claim 1, wherein the channel region and the first region are doped based on a super sharp retrograde doping profile.

7. The apparatus of claim 1, further comprising:
   a dielectric layer formed on a surface of the channel region;
   a metal gate formed on a surface of the dielectric layer;
   a source region formed on the surface of the diffusion barrier;
   a drain region formed on the surface of the diffusion barrier;
   a first shallow trench isolation (STI) region adjacent to the source region; and
   a second STI region adjacent to the drain region.

8. The apparatus of claim 7, wherein the back gate contact extends through the dielectric layer.

9. The apparatus of claim 1, wherein the apparatus is a planar metal-oxide-semiconductor field-effect transistor (MOSFET).

10. The apparatus of claim 1, wherein the apparatus is a fin-type field-effect transistor (FinFET).

11. The apparatus of claim 1, further comprising:
    a shallow trench isolation (STI) region adjacent to the back gate contact, the STI configured to isolate the back gate contact from the diffusion barrier.

12. An apparatus comprising:
    means for blocking dopant diffusion, wherein the means for blocking dopant diffusion is formed on a surface of a heavily doped region of a substrate, and wherein the means for blocking dopant diffusion is formed using a first material having a first band gap energy;
    means for providing a conduction channel, wherein the means for providing the conduction channel is formed on a surface of the means for blocking dopant diffusion, and wherein the means for providing the conduction channel is formed using a second material having a second band gap energy that is lower than the first band gap energy; and
    means for controlling a threshold voltage, wherein the means for controlling the threshold voltage extends into the heavily doped region of the substrate.

13. The apparatus of claim 12, wherein the heavily doped region has a higher doping concentration than the means for providing the conduction channel.

14. The apparatus of claim 12, wherein the first material comprises a III-V compound or a II-VI compound.

15. The apparatus of claim 12, wherein the first material comprises aluminum arsenide or indium aluminum arsenide.

16. The apparatus of claim 12, wherein the second material comprises gallium arsenide or indium gallium arsenide.

17. The apparatus of claim 12, wherein the apparatus is formed according to a super sharp retrograde doping profile.

* * * * *